(12) United States Patent
Maier et al.

(10) Patent No.: US 12,143,779 B2
(45) Date of Patent: Nov. 12, 2024

(54) AIRFLOW SENSORS FOR SPEAKERS

(71) Applicant: Apple Inc., Cupertino, CA (US)

(72) Inventors: Daniel W. Maier, San Jose, CA (US);
Justin D. Crosby, Cupertino, CA (US);
Thomas Møller Jensen, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 141 days.

(21) Appl. No.: 17/383,396

(22) Filed: Jul. 22, 2021

(65) Prior Publication Data
US 2023/0024087 A1 Jan. 26, 2023

(51) Int. Cl.
H04R 29/00 (2006.01)
H04R 1/02 (2006.01)
H04R 9/02 (2006.01)
H10N 30/30 (2023.01)

(52) U.S. Cl.
CPC ........... H04R 29/001 (2013.01); H04R 1/023 (2013.01); H04R 9/022 (2013.01); H10N 30/30 (2023.02); *H04R 2499/11* (2013.01)

(58) Field of Classification Search
CPC .... H04R 29/00; H04R 29/001; H04R 29/003; H04R 1/023; H04R 9/022; H04R 2499/11; H10N 30/30
USPC ................ 381/56, 58, 59, 98, 104, 101, 102
See application file for complete search history.

(56) References Cited

U.S. PATENT DOCUMENTS

| | | | |
|---|---|---|---|
| 5,293,095 A * | 3/1994 | Tamura | G08B 13/1681 310/317 |
| 6,688,169 B2 | 2/2004 | Choe et al. | |
| 7,885,420 B2 | 2/2011 | Hetherington et al. | |
| 9,247,342 B2 * | 1/2016 | Croft, III | H04R 3/002 |
| 2004/0101153 A1* | 5/2004 | Grudin | H04R 29/001 381/357 |
| 2016/0202224 A1* | 7/2016 | Lloyd | G05D 7/01 73/865.8 |
| 2018/0356266 A1* | 12/2018 | Robbins | G01F 1/36 |

OTHER PUBLICATIONS

Shust et al., "Electronic Removal of Outdoor Microphone Wind Noise," Acoustical Society of America 136 Meeting Lay Language Papers, Oct. 1998, retrieved from https://acoustics.org/pressroom/httpdocs/136th/mshust.htm, 5 pages.
Indian Office Action from Indian Patent Application No. 202214041576, dated May 9, 2024, 5 pages.

* cited by examiner

Primary Examiner — Ahmad F. Matar
Assistant Examiner — Sabrina Diaz
(74) Attorney, Agent, or Firm — BAKERHOSTETLER

(57) ABSTRACT

Aspects of the subject technology relate to electronic devices having speakers and airflow sensors for the speakers. In one or more implementations, the airflow sensor may be formed, in part, by a mesh structure that spans a port in a housing of the electronic device. In one or more implementations, the airflow sensor may be formed, in part, by an exposed portion of a conductive trace of the speaker.

22 Claims, 10 Drawing Sheets

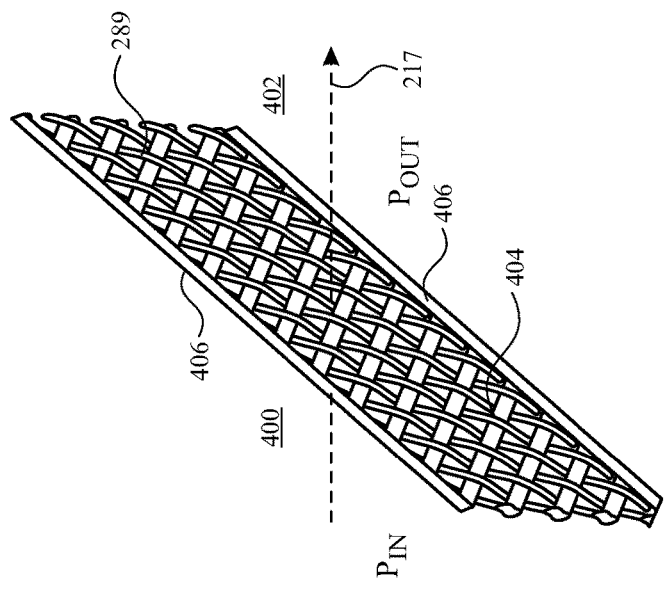
FIG. 4
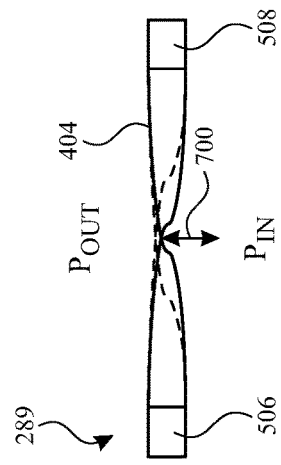
FIG. 7
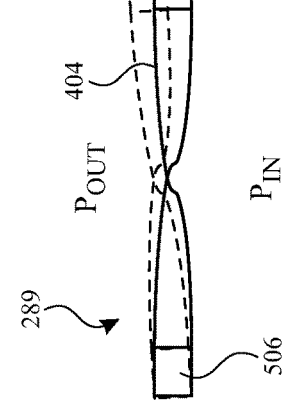
FIG. 6
FIG. 5

AIRFLOW SENSORS FOR SPEAKERS

TECHNICAL FIELD

The present description relates generally to electronic devices having audio transducers, including, for example, airflow sensors for speakers.

BACKGROUND

Electronic devices such as computers, media players, cellular telephones, wearable devices, and headphones are often provided with speakers for generating audio output from the device. However, it can be challenging to integrate speakers that generate high quality sound into electronic devices, particularly in compact devices such as portable electronic devices.

BRIEF DESCRIPTION OF THE DRAWINGS

Certain features of the subject technology are set forth in the appended claims.

However, for purpose of explanation, several aspects of the subject technology are set forth in the following figures.

FIG. 4 illustrates a perspective view of a mesh structure for an electronic device in accordance with various aspects of the subject technology.

FIGS. 5-7 illustrate various exemplary measurable effects of airflow on a mesh structure for an electronic device in accordance with various aspects of the subject technology.

DETAILED DESCRIPTION

Figure 1:
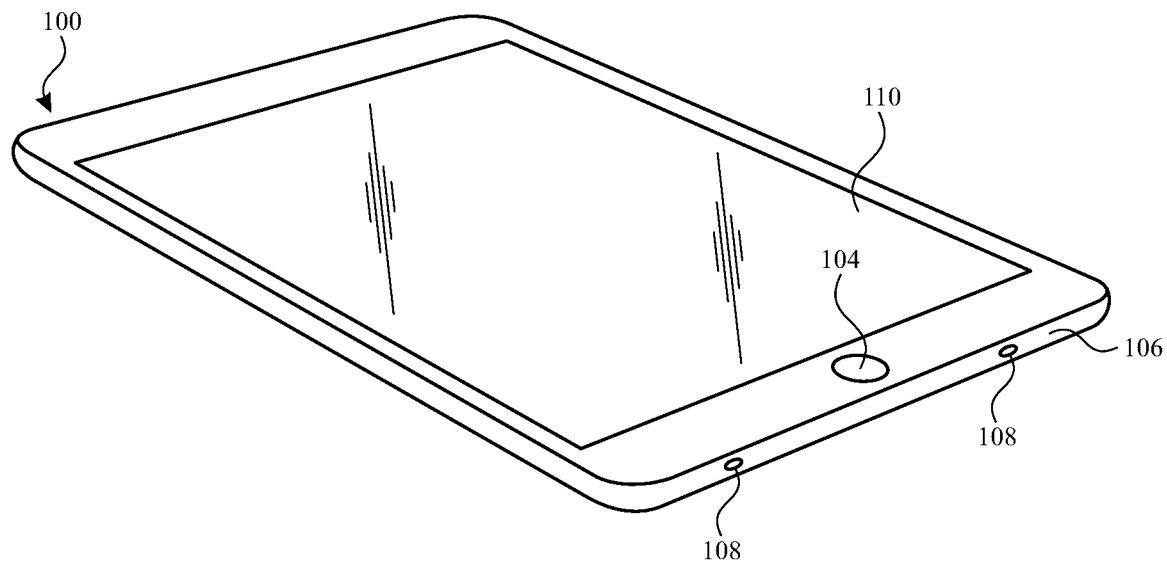
FIG. 1 illustrates a perspective view of an example electronic device having an airflow sensor in accordance with various aspects of the subject technology.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced without these specific details. In some instances, well-known structures and components are shown in block diagram form in order to avoid obscuring the concepts of the subject technology.

Portable electronic devices such as a mobile phones, portable music players, tablet computers, laptop computers, wearable devices such as smart watches, headphones, earbuds, other wearable devices, and the like often include one or more audio transducers such as a microphone for receiving sound input, or a speaker for generating sound.

However, challenges can arise when constraints for spatial integration with other device components, cosmetic constraints, and/or other constraints compete with audio quality constraints when attempting to implement an audio transducer module (e.g., a speaker or speaker module) in a device. These challenges can be particularly difficult when attempting to implement an audio transducer module into a compact device such as a portable or a wearable device.

For example, a speaker component that is mounted within an electronic device may route sound, generated by a moving diaphragm of the speaker component, through an output port to the external environment of the electronic device. However, in many implementations including implementations in compact devices, the cross-sectional area of the airflow path from the front volume of the speaker to the output port can narrow significantly, which can create a high velocity airflow through the output port. In some cases, this high velocity airflow can be heard and/or felt by a user of the device, which can be undesirable, particularly if the sound of the airflow can be heard over portions of desired audio output from the speaker component.

One option for reducing the effect of high velocity airflow through the output port is to use a static equalizer to modify the audio output, such as to reduce frequencies of sound that are expected to generate such high-velocity flows. However, without real-time information as to the airflow being generated by particular audio content, this type of static equalization can undesirably overcorrect the audio output in some scenarios (e.g., including scenarios in which no correction is needed), and/or can undercorrect the audio output in other scenarios.

In accordance with various aspects of the subject disclosure, an electronic device having a speaker is also provided with an airflow sensor. The electronic device may obtain airflow measurements of airflow through an output port of the speaker, in real time while generating audio output with the speaker. The electronic device may modify the audio output being generated by the speaker based on the real time airflow measurements from the airflow sensor. As described in further detail hereinafter, in various implementations, the airflow sensor may incorporate a portion of a mesh structure of the electronic device, may include a piezoelectric component, may include a capacitive sensing component, may form an anemometer, may include a heat pipe, and/or may include an exposed portion of a conductive trace of the speaker.

An illustrative electronic device including a speaker is shown in FIG. 1. In the example of FIG. 1, electronic device 100 (e.g., an electronic device) has been implemented using a housing that is sufficiently small to be portable and carried by a user (e.g., electronic device 100 of FIG. 1 may be a handheld electronic device such as a tablet computer or a cellular telephone or smart phone). As shown in FIG. 1, electronic device 100 includes a display such as display 110 mounted on the front of housing 106. Electronic device 100 includes one or more input/output devices such as a touch screen incorporated into display 110, a button or switch such as button 104 and/or other input output components disposed on or behind display 110 or on or behind other portions of housing 106. Display 110 and/or housing 106 include one or more openings to accommodate button 104, a speaker, a light source, or a camera.

In the example of FIG. 1, housing 106 includes two openings 108 on a bottom sidewall of housing 106. One or more of openings 108 forms a port for an audio component. For example, one of openings 108 may form a speaker port for a speaker disposed within housing 106 and another one of openings 108 may form a microphone port for a microphone disposed within housing 106. Openings 108 may be open ports or may be completely or partially covered with a permeable membrane or a mesh structure that allows air and sound to pass through the openings. Although two openings 108 are shown in FIG. 1, this is merely illustrative. One opening 108, two openings 108, or more than two openings 108 may be provided on the bottom sidewall (as shown) on another sidewall (e.g., a top, left, or right sidewall), on a rear surface of housing 106 and/or a front surface of housing 106 or display 110. In some implementations, one or more groups of openings 108 in housing 106 may be aligned with a single port of an audio component within housing 106. Housing 106, which may sometimes be referred to as a case, may be formed of plastic, glass, ceramics, fiber composites, metal (e.g., stainless steel, aluminum, etc.), other suitable materials, or a combination of any two or more of these materials.

The configuration of electronic device 100 of FIG. 1 is merely illustrative. In other implementations, electronic device 100 may be a computer such as a computer that is integrated into a display such as a computer monitor, a laptop computer, a wearable device such as a smart watch, a pendant device, or other wearable or miniature device, a media player, a gaming device, a navigation device, a computer monitor, a television, a headphone, an earbud, or other electronic equipment.

In some implementations, electronic device 100 may be provided in the form of a wearable device such as a smart watch. In one or more implementations, housing 106 may include one or more interfaces for mechanically coupling housing 106 to a strap or other structure for securing housing 106 to a wearer. Electronic device 100 may include one, two, three, or more than three audio components each mounted adjacent to one or more of openings 108.

A speaker disposed within housing 106 transmits sound through at least one associated opening 108. A microphone may also be provided within housing 106 that receives sound through at least one associated opening in the housing 106. In one or more implementations, a speaker (e.g., speaker module) may be mounted such that an output port of the speaker is mounted adjacent to, and aligned with a corresponding opening 108. The speaker may include a front volume, a diaphragm, and an output port, and may include or incorporate a portion of an airflow sensor, as described in further detail hereinafter.

Figure 2:
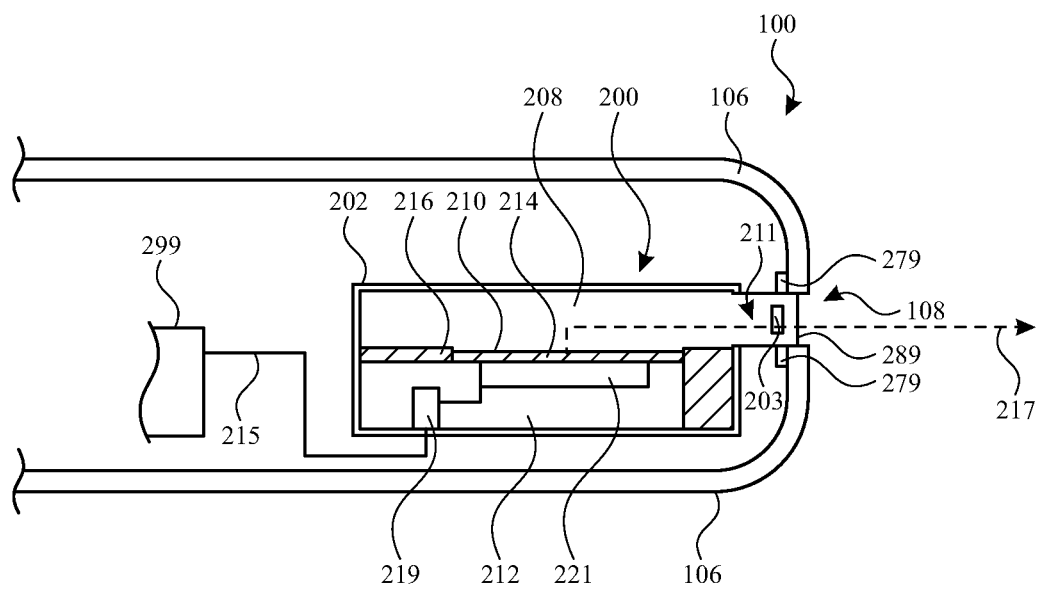
FIG. 2 illustrates a cross-sectional side view of a portion of an example electronic device having a speaker and an airflow sensor in accordance with various aspects of the subject technology.

FIG. 2 illustrates a cross-sectional view of a portion of electronic device 100 in which an audio component is mounted. In the example of FIG. 2, electronic device 100 includes speaker 200 (also referred to herein as a speaker module or speaker component). Speaker 200 includes housing 202 mounted adjacent at least one opening 108 in housing 106 of the electronic device 100. Housing 202 (e.g., a speaker housing of the speaker module) may be formed form one or more materials such as plastic and/or metal. As shown, speaker 200 may include a front volume 208 and a back volume 212 that are separated by a structure 210. The structure 210 may include a diaphragm 214 that is actuatable to generate sound, and a structure 216 (e.g., an interior wall to which the diaphragm 214 is mounted), that at least partially separates the front volume 208 and the back volume 212.

Circuitry 221 (e.g., including one or more magnets and a voice coil for actuating the diaphragm 214 to generate sound) of the speaker 200 may be coupled to device circuitry such as device circuitry 299 (e.g., one or more processors of the device) via a connector 215. Connector 215 may include a flexible integrated circuit or another flexible or rigid conductive connector. In one or more implementations, the circuitry 221 may be coupled to speaker circuitry 219 (e.g., one or more integrated circuits and/or other processing circuitry within the speaker 200 for processing audio content from the device circuitry 299 and/or airflow feedback from an airflow sensor, and/or for operating the circuitry 221 to move the diaphragm), which is couped to the circuitry 221. In one or more other implementations, the device circuitry 299 may be coupled directly to the circuitry 221.

As shown, speaker 200 may include an output port 211 that is acoustically coupled to the front volume 208 and aligned with and mounted adjacent to an opening 108, so that sound generated by the diaphragm 214 (e.g., responsive to control signals received from control circuitry such as device circuitry 299) can be transmitted through the opening 108 to the external environment. For example, the output port 211 may be sealed to the opening 108 using a sealing material 279. Opening 108 may be an open port, or may be covered by a mesh structure 289 that spans the opening 108 and that is permeable to sound and air. In various implementations, the mesh structure 289 may be primarily a cosmetic mesh structure that prevents a view through the opening 108 into the internal cavity of the speaker 200 and/or the housing 106, a passively functional mesh structure that prevents dust and/or other debris from passing through the opening 108 into the internal cavity of the speaker 200 and/or the housing 106, and/or an actively functional mesh structure that forms a portion of an airflow sensor for the electronic device 100.

For example, as shown in FIG. 2, the electronic device 100 may include an airflow sensor 203 disposed at least partially within the output port 211. In one or more implementations, the mesh structure 289 may form a portion of the airflow sensor 203 or may be separate from the airflow sensor 203. In the example of FIG. 2, the arrow 217 indicates an airflow path along which, when the diaphragm 214 is actuated to generate sound, the diaphragm 214 may push air from the front volume 208 through the output port 211 and the opening 108. The narrow cross-sectional area of the output port 211, relative to a cross-sectional area of the front volume 208, can cause acceleration of the airflow along the airflow path indicated by the arrow 217. Airflow sensor 203 may obtain airflow measurement data corresponding to the velocity of the airflow through the output port 211, and provide a sensor signal (e.g., an airflow measurement and/or sensor signals from which the airflow measurement can be derived by the speaker circuitry 219 and/or the device circuitry 299) to the speaker circuitry 219 and/or the device circuitry 299.

Figure 3:
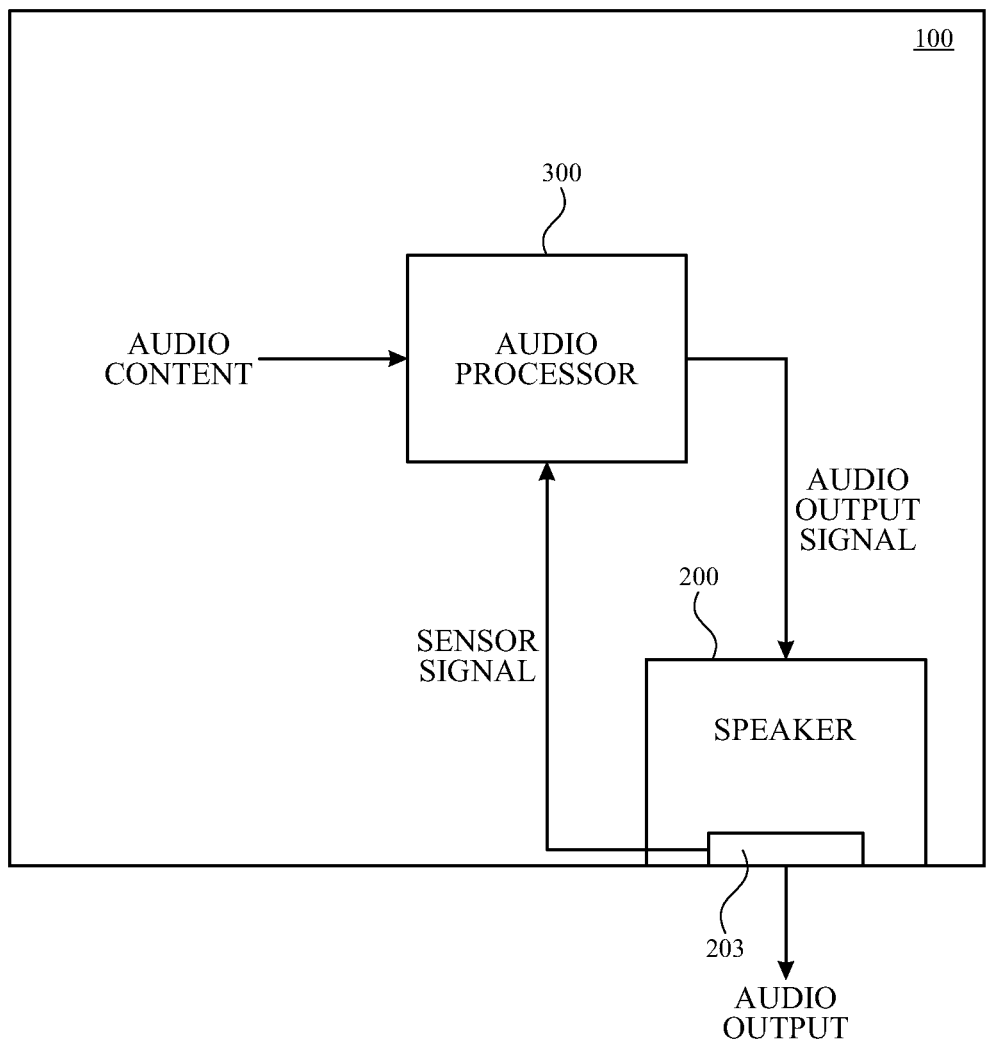
FIG. 3 illustrates a schematic diagram of an electronic device having a speaker and an airflow sensor in accordance with various aspects of the subject technology.

For example, FIG. 3 illustrates a schematic diagram of the electronic device 100 illustrating an audio output correction operation using airflow feedback from the airflow sensor 203. As shown in FIG. 3, the electronic device 100 may include an audio processor 300 (e.g., an implementation of speaker circuitry 219 and/or device circuitry 299 of FIG. 2 and/or implemented in software running on speaker circuitry 219 and/or device circuitry 299). As shown, the audio processor 300 may receive audio content (e.g., music content, an audio portion of video content, a podcast, or any other audio content), such as from memory of the device or from the device circuitry 299, and may also receive a sensor signal from the airflow sensor 203. In one or more implementations, the audio processor 300 may generate an audio output signal and provide the audio output signal to the speaker 200. The speaker 200 (e.g., the speaker circuitry 219 and/or the circuitry 221) may then generate audio output (e.g., sound), by moving the diaphragm 214 of FIG. 2) and guide the audio output to the external environment of the electronic device 100 via the output port 211. In one or more implementations, the audio processor 300 may also adjust and/or otherwise modify the audio output signal based on the sensor signal from the airflow sensor 203.

For example, the audio processor 300 may reduce the power of one or more frequencies of the audio output signal when the sensor signal from the airflow sensor 203 indicates that the velocity and/or the volume of the airflow through the output port 211 is above a threshold value. In various implementations, the threshold value may be a fixed, predetermined value, or the threshold may be an adaptive threshold that depends on the audio content and/or one or more output settings, such as a volume of the audio output.

As discussed above in connection with FIG. 2, in one or more implementations, a mesh structure 289 that spans the opening 108 may form a portion of the airflow sensor 203. For example, as shown in FIG. 4, mesh structure 289 may include a mesh of woven wire structures 404. In one or more implementations, the mesh structure 289 may also include a frame structure 406. In the example of FIG. 4, the frame structure 406 is shown along the two opposing long edges of the mesh structure 289. However, in various implementations, the frame structure 406 may run along any portion or, any number of portions of the mesh structure 289, or continuously around the entire periphery of the mesh structure 289. In one more implementations, openings between the woven wire structures 404 may allow sound and airflow to pass through the mesh structure 289 (e.g., the sound and airflow generated by the operation of the speaker 200).

However, the mesh structure 289 may also inhibit the airflow along the direction indicated by the arrow 217, such that the air pressure (Pin) on an interior side 400 of the mesh structure 289 is higher than the pressure (Pout) on an exterior side 402 of the mesh structure 289, by an amount that increases or decreases with increased or decreased airflow, respectively. This pressure differential across the mesh structure 289, caused by the airflow generated by the speaker 200, can cause measurable deflections and/or deformations of the mesh structure 289, in one or more implementations.

As examples, FIGS. 5, 6, and 7 illustrate exemplary effects of airflow on the mesh structure 289 that can be measured, to measure the airflow through an airflow path that includes the output port 211 of the speaker 200 and the opening 108 in the housing 106. As one example, FIG. 5 illustrates an implementation in which a first mounting structure 506 (e.g., a portion of the frame structure 406) on a first end of the mesh structure 289 is fixed (e.g., to an interior edge of the opening 108 in the housing 106), and a second mounting structure 508 (e.g., a portion of the frame structure 406) on an opposing second end of the mesh structure 289 is movable. As shown in FIG. 5, in this implementation, the higher pressure, Pin, on the interior side 400 of the mesh structure 289 may cause the mesh structure 289 to rotate in a cantilever action about the fixed end of the mesh structure, as indicated by the arrows 500.

As another example, FIG. 6 illustrates an implementation in which both the first mounting structure 506 (e.g., a portion of the frame structure 406) on the first end of the mesh structure 289 and the second mounting structure 508 (e.g., a portion of the frame structure 406) on the opposing second end of the mesh structure 289 are movable (e.g., movably mounted at or near opposing sides of the interior edge of the opening 108) such that the entire mesh structure can move, as indicated by the arrows 600. As another example, FIG. 7 illustrates an implementation in which both the first mounting structure 506 (e.g., a portion of the frame structure 406) on the first end of the mesh structure 289 and the second mounting structure 508 (e.g., a portion of the frame structure 406) on the opposing second end of the mesh structure 289 are fixed (e.g., fixedly mounted at or near opposing sides of the interior edge of the opening 108) such that the overall mesh structure is fixed, and one or more of the woven wire structures 404 are deformable or deflectable by the airflow/pressure differential across the mesh structure, as indicated by the arrows 700.

In order to measure deflections of the mesh structure 289 as illustrated in FIG. 5 or 6, or deformations or deflections of the mesh structure 289 as illustrated in the example of FIG. 7, the mesh structure 289 may be integrated into an airflow sensor. For example, the mesh structure 289 may be integrated into an airflow sensor 203 by coupling the mesh structure 289 to one or more electrical (conductive) leads, and/or by mounting and/or supporting the mesh structure 289 using a piezoelectric material. For example, in various implementations, the electronic device 100 (see FIG. 1) may include a housing 106 housing having an opening 108, a mesh structure 289 spanning the opening 108, a speaker 200 disposed within the housing 106 and having an output port 211 aligned with the opening 108 in the housing 106, and an airflow sensor 203 formed at least in part by the mesh structure 289.

Figure 8:
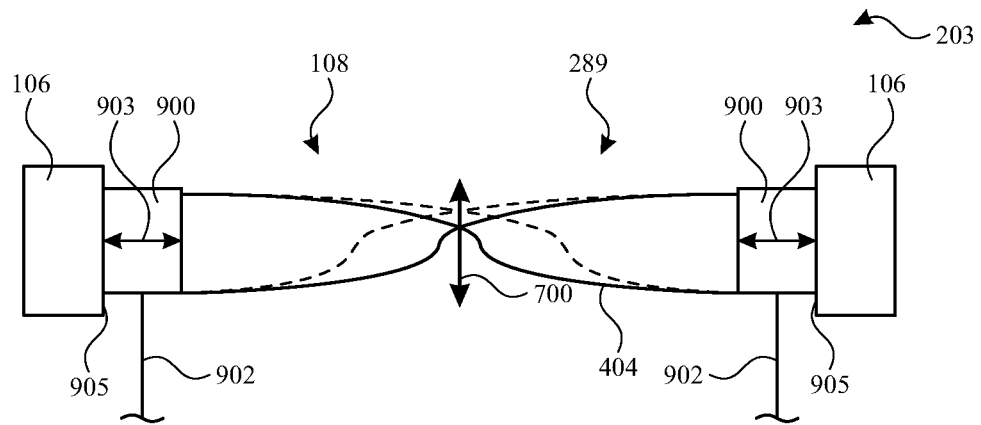
FIG. 8 illustrates a portion of an example airflow sensor that includes a piezoelectric mount for a mesh structure for an electronic device in accordance with various aspects of the subject technology.

For example, FIG. 8 illustrates an implementation in which the airflow sensor 203 includes a piezoelectric mount 900 that couples an edge of the mesh structure 289 to an interior edge 905 of the opening 108. For example, the piezoelectric mount 900 may be an implementation of the frame structure 406 using a piezoelectric material (as in the example of FIG. 8) or the piezoelectric mount 900 may be mounted to the frame structure 406 (e.g., between the frame structure 406 and the interior edge 905 of the opening 108). In the example of FIG. 8, the piezoelectric mount 900 may be a unimorph piezoelectric structure (e.g., a piezoelectric structure that generates a signal when deformed in one direction). As shown in the example of FIG. 8, when one or more of the woven wire structures 404 is deformed or deflected (as indicated by the arrows 700), the deformation or deflection of the one or more of the woven wire structures 404 may pull on the piezoelectric mount(s) 900, causing a corresponding deformation of the piezoelectric mount(s) 900, as indicated by the arrows 903. As shown, the airflow sensor 203 may include one or more electrical leads 902 (e.g., conductive leads) coupled to the piezoelectric mounts 900, for reading out an electrical response to the deformation of the piezoelectric mounts 900 that can be used to determine the velocity and/or amount of airflow. Electrical leads 902 may be implemented as wire leads, or may be embedded in a structure or substrate, such as in a flexible printed circuit, and may communicatively couple one or more of the piezoelectric mounts 900 to speaker circuitry 219 and/or device circuitry 299, in various implementations. The electronic device 100 (e.g., audio processor 300) may then adjust the audio output of the speaker 200 based on the measured velocity and/or amount of airflow. It is appreciated that the deformation and/or deflection of the woven wire structures 404 illustrated in FIGS. 7 and 8 are exaggerated for illustrative purposes, and, in an implemented device, may be smaller than depicted in these figures (e.g., small enough to be imperceptible without the use of the strain gauge and/or piezoelectric sensing components in some implementations).

Figure 9:
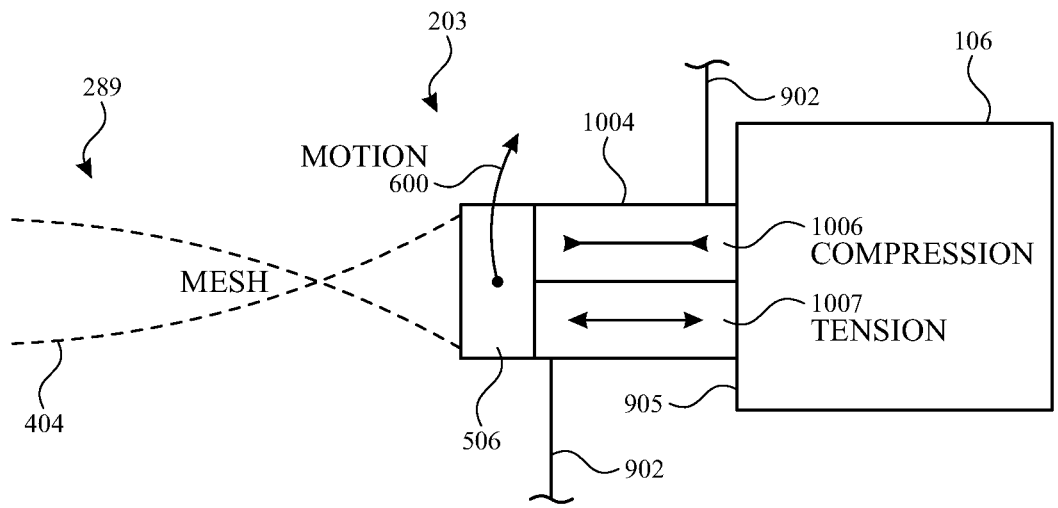
FIGS. 9 and 10 illustrate a portion of another example airflow sensor that includes a piezoelectric mount for a mesh structure for an electronic device in accordance with various aspects of the subject technology.
Figure 10:
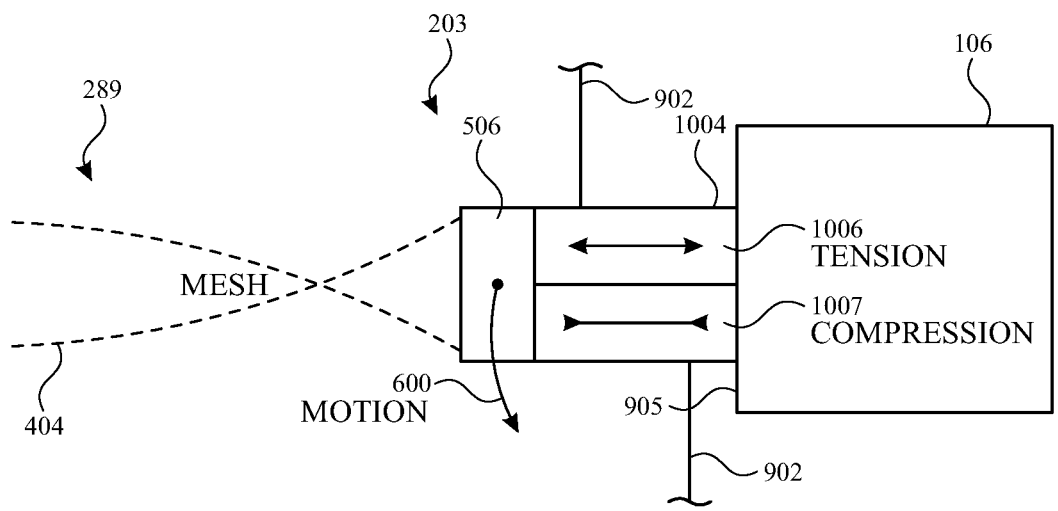

In the example of FIG. 8, both ends of the mesh structure 289 are fixed (e.g., to the frame structure 406 and/or to the interior edge 905 of the opening 108), and the deformation and/or deflection of the woven wire structures 404 is detectable due to the resulting force (tension) on the fixed piezoelectric mounts 900. FIGS. 9 and 10 illustrate another example in which the mesh structure 289 includes a piezoelectric mount 1004 that rotatably supports and/or is attached to a first end (e.g., at a first mounting structure 506, which may be implemented as a first portion of frame structure 406) of the mesh structure 289 adjacent to a first side of the opening 108.

In this example, the first end of the mesh structure 289 is rotatably attached to the piezoelectric mount 1004, and an opposing second end of the mesh structure (e.g., at the second mounting structure 508, as shown in FIG. 5) is movable with respect to an opposing second side of the opening (as indicated by arrows 500 in FIG. 5). In this example, the piezoelectric mount 1004 may be formed by a bimorph piezoelectric structure that includes a first piezoelectric layer 1006 and a second piezoelectric layer 1007. As illustrated in FIGS. 9 and 10, the tension/compression axis on the first piezoelectric layer 1006 and the second piezoelectric layer 1007 may shift depending on rotation of the mesh structure 289 (e.g., as indicated by the arrows 600 in FIGS. 9 and 10) due to the motion of the opposing second end of the mesh structure 289 (as indicated by arrows 500 of FIG. 5). Electrical signals generated by the first piezoelectric layer 1006 and the second piezoelectric layer 1007 due to the illustrated compression and tension forces can be used to detect the rotation of mesh structure 289 based on detected bending of the piezoelectric mount 1004 in one or more implementations. For example, in FIG. 9, the illustrated rotation of the mesh structure 289 may cause a compression of the first piezoelectric layer 1006 and a tension on the second piezoelectric layer 1007, which may generate corresponding electrical signals, which can be read out by electrical (conductive) leads 902. In the example of FIG. 10, an opposite rotation of the mesh structure 289 may cause a tension on the first piezoelectric layer 1006 and a compression of the second piezoelectric layer 1007, which may generate corresponding electrical signals, which can be read out by electrical (conductive) leads 902. Because the rotation of the mesh structure 289 is dependent on the velocity and/or amount of airflow through the mesh structure generated by the speaker 200, the electrical signals from the piezoelectric mount 1004 may be used to determine the velocity and/or amount of airflow through the airflow path including the output port 211 and the opening 108. The electronic device 100 (e.g., audio processor 300) may then adjust the audio output of the speaker 200 based on the measured velocity and/or amount of airflow.

In the example of FIGS. 9 and 10, the piezoelectric mount 1004 is mounted to the fixed end of the mesh structure 289 (having an opposing moveable end), so that the tension and compression of the piezoelectric mount 1004 is generated at or near the rotational axis of the cantilevered motion of the mesh structure (e.g., rotational motion about the piezoelectric mount 1004).

Figure 11:
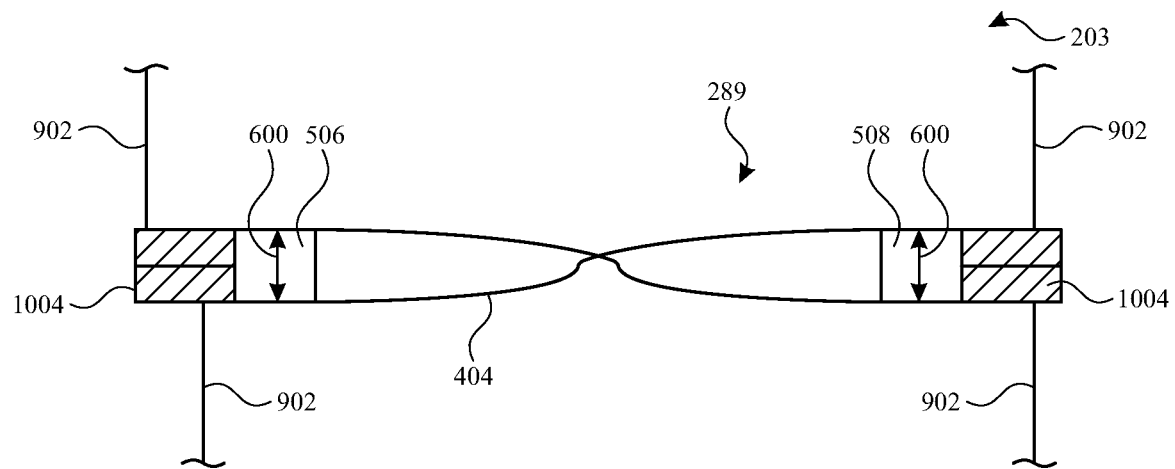
FIG. 11 illustrates a portion of another example airflow sensor that includes a piezoelectric mount for a mesh structure for an electronic device in accordance with various aspects of the subject technology.

In the example of FIGS. 9 and 10, the piezoelectric mount 1004 on one side of the mesh structure 289 is used to measure a rotational deflection of the mesh structure 289. However, as shown in FIG. 11, in one or more other implementations, piezoelectric mounts 1004 may be used to mount both ends of the mesh structure 289 adjacent to the opening 108 (e.g., to the interior edge 905 of the opening). In this implementation, tension and/or compression on the layers (the first piezoelectric layer 1006 and/or the second piezoelectric layer 1007 as illustrated in FIGS. 9 and 10) of the piezoelectric mounts 1004 may generate electrical signals that can be used to measure bulk deflections of the mesh structure 289 as indicated by the arrows 600. In the examples of FIGS. 9, 10 and 11, the piezoelectric mount 1004 is disposed between an edge of the mesh structure 289 and the interior edge 905 of the opening 108. In one or more other implementations, the piezoelectric mount 1004 may be coupled to the mesh structure 289 in other arrangements, such as coupled to a top surface of the end of the mesh structure 289 or a bottom surface of the end of the mesh structure 289, or any other arrangement in which rotational and/or linear deflections of the mesh structure 289 cause a response in the piezoelectric material of the piezoelectric mount.

In the examples of FIGS. 8-11, arrangements are described in which one or more portions of the mesh structure 289 are mounted to or near the opening 108 by one or more piezoelectric mounts. However, it is also understood that piezoelectric structures and/or materials can be coupled to the mesh structure 289 for detection of deflections of mesh structure 289 and/or a portion thereof, without using the piezoelectric material as a mounting structure (e.g., by mounting the mesh structure 289 at, near, or within the opening 108 using other mounting structures and/or materials in addition to the piezoelectric material that is coupled to the mesh structure for sensing).

Figure 12:
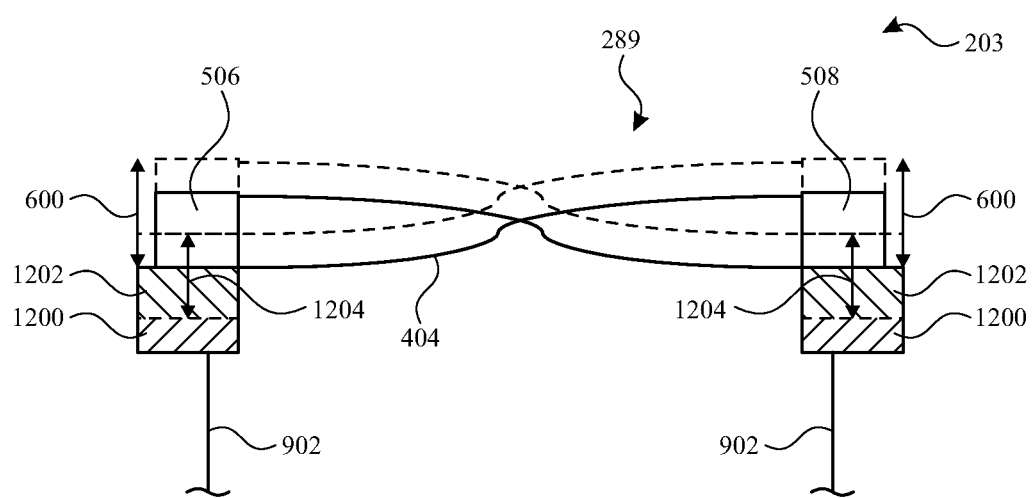
FIG. 12 illustrates a portion of an example airflow sensor that includes a capacitive sensor for a mesh structure for an electronic device in accordance with various aspects of the subject technology.

FIG. 12 illustrates another example implementation of the airflow sensor 203, in which the airflow sensor 203 includes one or more capacitive sensors separated and/or spaced apart from a moveable end of the mesh structure 289. For example, as shown in FIG. 12, the first mounting structure 506 (which may be an implemented as a portion of the frame structure 406) may be mounted to an elastomeric structure 1202 that resiliently couples a moveable end of the mesh structure 289 to a capacitive sensor 1200 that is fixed in position. In this example, the second mounting structure 508 (which may be an implemented as a portion of the frame structure 406) may also mounted to an elastomeric structure 1202 that resiliently couples a moveable end of the mesh structure 289 to a capacitive sensor 1200 that is fixed in position. The elastomeric structures 1202 may be formed from an elastomeric insulating material (e.g., a rubber or foam) or an elastomeric dielectric material that enhances capacitive changes between the first mounting structure 506 and the second mounting structure 508 and the corresponding capacitive sensors 1200. In one or more other implementations, the elastomeric material may be disposed between the ends of the mesh structure 289 and the interior edge 905 of the opening 108, and the first mounting structure 506 and the second mounting structure 508 may be separated from the respective capacitive sensors 1200 by an air gap.

In the example of FIG. 12, a bulk motion of the mesh structure 289 (e.g., due to airflow generated by the speaker 200) may cause the elastomeric structure 1202 to stretch (e.g., as indicated by arrows 1204) and allow the first mounting structure 506 and the second mounting structure 508 to move away from and/or toward the capacitive sensors 1200 (e.g., as indicated by arrows 600). In implementations in which the first mounting structure 506 and the second mounting structure 508 are formed from a conductive material (e.g., a metal), the resulting changes in distance between the first mounting structure 506 and the second mounting structure 508 and the corresponding capacitive sensors 1200 may cause a capacitance change between the first mounting structure 506 and the second mounting structure 508 and the corresponding capacitive sensors 1200, which can be detected using electrical leads 902. Because the motion of the mesh structure 289 is dependent on the velocity and/or amount of airflow through the mesh structure generated by the speaker 200, the electrical signal from capacitive sensors 1200 may be used to determine the velocity and/or amount of airflow through the airflow path including the output port 211 and the opening 108 can be measured. The electronic device 100 (e.g., audio processor 300) may then adjust the audio output of the speaker 200 based on the measured velocity and/or amount of airflow.

In the examples of FIGS. 9-12, deformations and/or deflections of the mesh structure 289 can be measured to determine a velocity and/or amount of airflow through the mesh structure (e.g., and hence through the airflow path including the output port 211 and the opening 108). However, other implementations are also contemplated, in which the mesh structure 289 is substantially fixed and non-deformable and forms a portion an airflow sensor for the speaker 200 and/or the electronic device 100.

Figure 13:
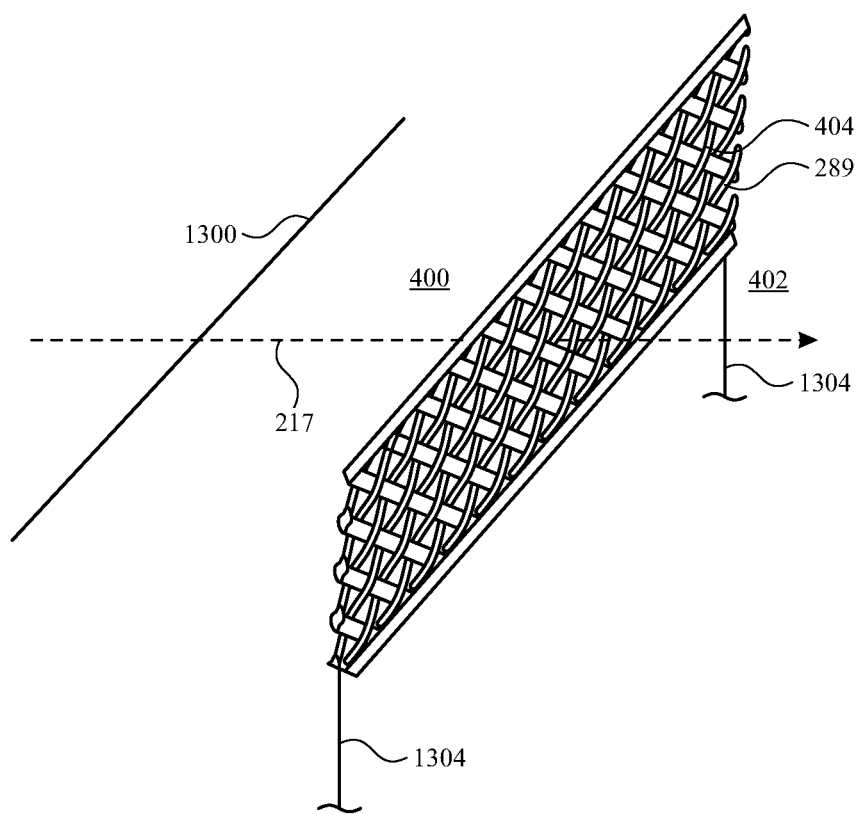
FIG. 13 illustrates a portion of an example airflow sensor that includes an anemometer formed in part by a mesh structure for an electronic device in accordance with various aspects of the subject technology.

For example, FIG. 13 illustrates an implementation in which the airflow sensor 203 is implemented as an anemometer formed in part by the mesh structure 289. In the example of FIG. 13, a heating element 1300 (e.g., a drawn wire element) extends across the airflow pathway indicated by arrow 217, at a location interior to the mesh structure 289 (e.g., on the interior side 400 of the mesh structure 289). In this example, the heating element 1300 may be mounted at a location that is disposed between the mesh structure 289 and the front volume 208 of the speaker 200 (see, FIG. 2), and spans an airflow path including the output port 211 and the opening 108 in the housing 106.

Figure 14:
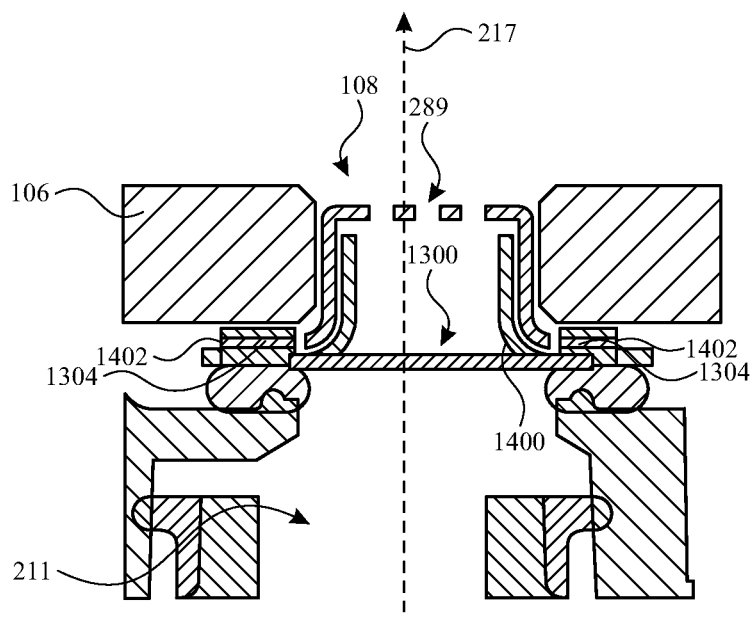
FIG. 14 illustrates a portion an example electronic device incorporating an airflow sensor that includes an anemometer formed in part by a mesh structure in accordance with various aspects of the subject technology.

For example, FIG. 14 illustrates a cross-sectional side view of a portion of the electronic device 100, in an exemplary implementation in which the heating element 1300 is mounted at a location that is disposed between the mesh structure 289 and the front volume 208 of the speaker 200 (see, FIG. 2), and spans an airflow path including the output port 211 and the opening 108 in the housing 106. In the example of FIG. 14, conductive leads 1304 are formed by conductive traces in a flex circuit 1402. The conductive leads 1304 may couple the mesh structure 289 to circuitry (e.g., speaker circuitry 219 and/or device circuitry 299) configured to measure resistive changes in the mesh structure 289 due to heat transfer to the mesh structure from the heating element by airflow through the airflow path indicated by the arrow 217.

In this example, the flex circuit 1402 may also include traces that provide a current through the heating element 1300. For example, the heating element 1300 may be an exposed, drawn and/or thinned portion of a conductive trace of the flex circuit(s) 1402 that generates heat due to the received current and the relative thinness of the heating element 1300, relative to thickness of the traces in the flex circuit(s). In this example, the mesh structure 289 and/or the heating element 1300 may be supported by a mounting structure 1400 (e.g., an insulating structure that separates the mesh structure 289 from the heating element 1300). However, this is merely illustrative, and in other implementations, the mesh structure can be mounted directly to or near the interior edge of the opening 108, and the heating element 1300 can be separately mounted across the airflow pathway.

In the examples of FIGS. 13 and 14, heat generated by the heating element 1300 may be transferred to air that passes by the heating element 1300 toward the mesh structure 289, along the direction indicated by the arrow 217. That heated air may then transfer a portion of the heat to the mesh structure 289. The amount of heat that is transferred, by the airflow, from the heating element 1300 to the mesh structure 289 will increase or decrease, respectively, with increased or decreased airflow. Accordingly, the velocity and/or amount of airflow can be measured by measuring the change in temperature of the mesh structure 289 in these implementations. The temperature of the mesh structure can be measured by a temperature sensor (e.g., a thermistor) directly coupled to the mesh structure, or by measuring a resulting change in an electrical property (e.g., resistance) of the mesh structure, using conductive leads 1304 (e.g., coupled to distance-separated conductive locations on the mesh structure). Conductive leads 1304 may be wire leads, or may be embedded in a structure such as a flexible printed circuit, and may communicatively couple one or more conductive portions of the mesh structure 289 to speaker circuitry 219 and/or device circuitry 299, in various implementations.

In various implementations, the heat generated by the heating element 1300 may be generated by a current that is passed through the heating element 1300, such as via conductive traces in flex circuit(s) 1402 or via other conductive leads to the heating element 1300. However, in one or more other implementations, the heating element 1300 may be heated via heat transfer from another location in the speaker 200 and/or the electronic device 100.

Figure 15:
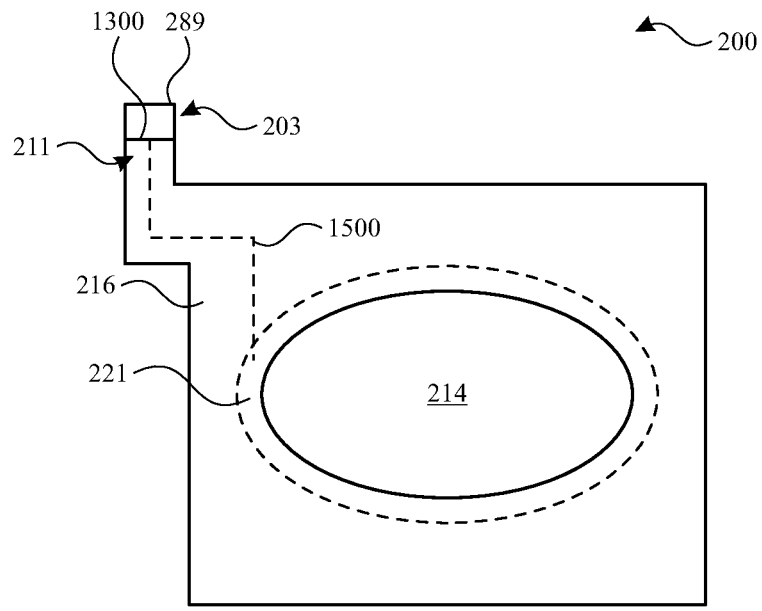
FIG. 15 illustrates a portion of an example airflow sensor that includes an anemometer having a heating element coupled to a heat pipe in accordance with various aspects of the subject technology.

For example, FIG. 15 illustrates an example in which the speaker 200 includes a heat pipe structure 1500 that thermally couples the heating element 1300 to circuitry 221 of the speaker 200 (e.g., to drive circuitry of the speaker). The example of FIG. 15 shows a top view of the speaker 200, and illustrates a possible path of the heat pipe structure 1500.

For example, during operation of the speaker 200, current through a voice coil of the circuitry 221, and/or motion of the voice coil relative to one or more magnets of the circuitry 221 can generate heat. In some implementations, this heat generated by the drive circuitry of the speaker 200 may be dissipated to other structures of the speaker 200 and/or the electronic device 100 (e.g., to be radiated or conductively or convectively transferred away from the electronic device as waste heat). However, in one or more implementations, the heat pipe structure 1500 (e.g., a thermally conductive structure) may extend from the heated drive circuitry of the speaker to the heating element 1300, and thereby conduct heat to the heating element 1300 when the speaker is in operation. As with the electrically heated implementations for the heating element 1300, a heating element 1300 that is heated via the heat pipe structure 1500 can transfer heat to airflow moving across the heating element 1300 toward the mesh structure 289, causing measurable temperature changes in the mesh structure 289 that can be measured to determine the velocity and/or amount of airflow being generated by the speaker 200. The electronic device 100 (e.g., audio processor 300) may then adjust the audio output of the speaker 200 based on the measured velocity and/or amount of airflow. Although various examples are described herein in which the mesh structure 289 forms a sensor for an anemometer implementation of the airflow sensor 203, in other implementations, a sensor wire or other sensing element can be provided separately from the heating element 1300, one or both of which can be disposed within the output port 211 of the speaker 200, between the output port 211 and the opening 108, and/or within the opening 108.

Figure 16:
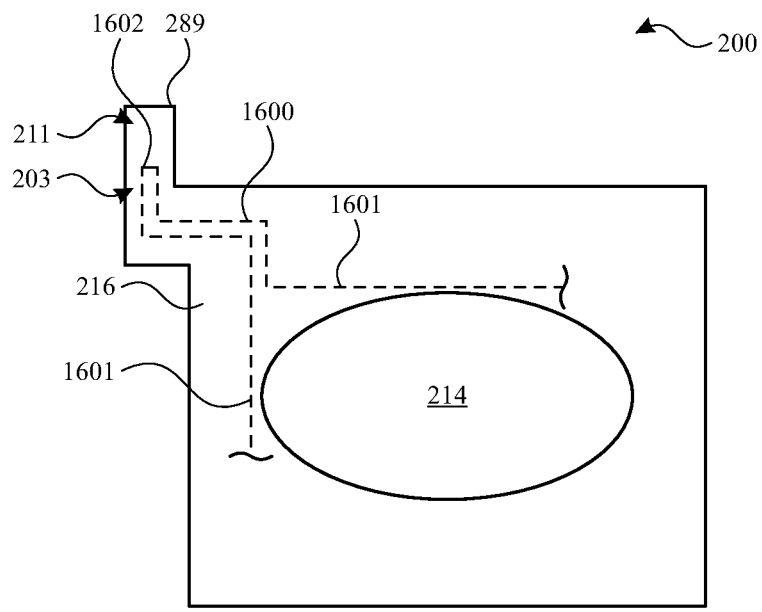
FIG. 16 illustrates a portion of an example airflow sensor that includes a portion of a conductive trace of an audio transducer in accordance with various aspects of the subject technology.

Various examples have been described herein in which an airflow sensor is formed, in part, by a mesh structure that spans an audio port in a housing of an electronic device. However, other implementations of an airflow sensor for an electronic device having a speaker are contemplated herein. For example, FIG. 16 illustrates a top view of the speaker 200, in an implementation in which an airflow sensor 203 for the speaker 200 is formed, in part, by a conductive trace 1600 having a first portion 1601 disposed in the back volume and running in parallel to a first side of the structure 216 that separates the front volume 208 (visible in the top view of FIG. 16) and the back volume 212 (see, FIG. 2) of the speaker 200, and a second portion 1602 disposed in the airflow path (e.g., the airflow path that includes the output port 211 and the opening 108). In this example, the first portion 1601 of the conductive trace 1600 may be coupled to speaker circuitry such as speaker circuitry 219 and/or circuitry 221. For example, the conductive trace 1600 (e.g., including the first portion 1601 and the second portion 1602) may conduct control signals from device circuitry 299 to speaker circuitry 219, from speaker circuitry 219 to circuitry 221 (e.g., to the voice coil of the speaker), and/or from the device circuitry 299 to the circuitry 221.

Figure 17:
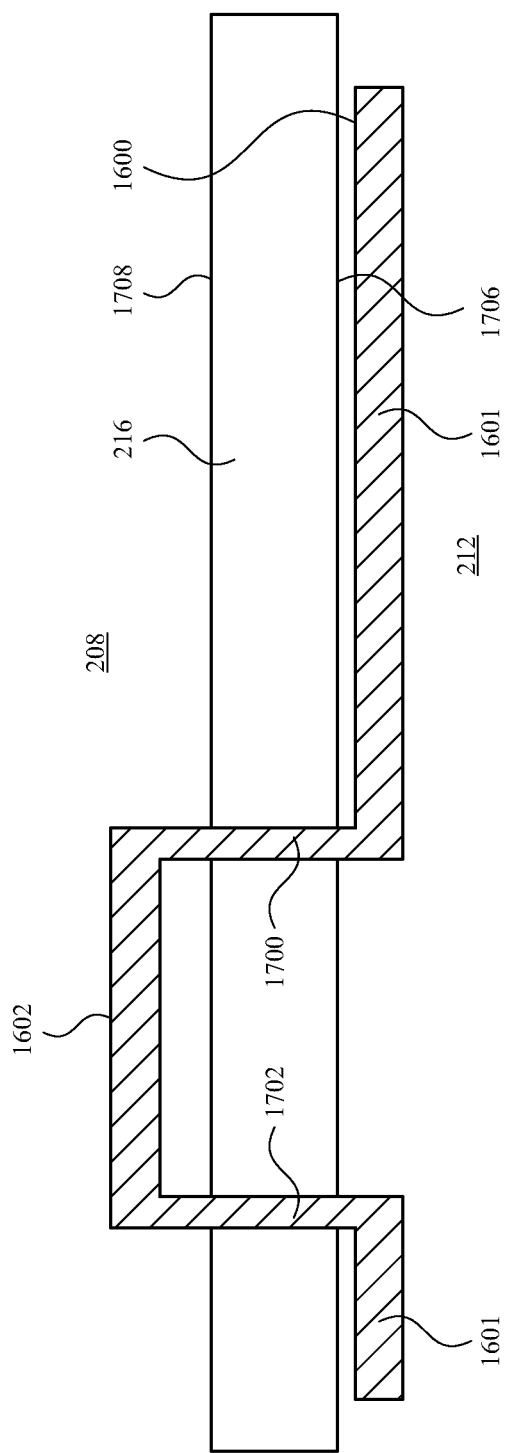
FIG. 17 illustrates a cross-sectional side view of the example airflow sensor of FIG. 16 in accordance with various aspects of the subject technology.

FIG. 17 illustrates a cross-sectional side view of a portion of the speaker 200 of FIG. 16. In the example of FIG. 17, the conductive trace 1600 includes a third portion 1700 that passes through the structure 216 from the back volume 212 to the front volume 208 at a first location. In this example, the conductive trace 1600 also includes a fourth portion 1702 that passes through the structure 216 from the front volume 208 to the back volume 212 at a second location. As shown, in this implementation, the first portion 1601 is disposed in the back volume 212 and runs in parallel to a first side 1706 of the structure 216 that separates the front volume 208 (visible in the top view of FIG. 16) and the back volume 212 (see, FIG. 2) of the speaker 200, the second portion 1602 runs along a portion of an opposing second side 1708 of the structure 216, the third portion 1700 extends through the structure 216 between the first portion 1601 and the second portion 1602 at the first location, and the fourth portion 1702 extends through the structure 216 between the first portion 1601 and the second portion 1602 at the second location.

As shown, the second portion 1602 may be separated from (e.g., spaced apart from) the second side 1708 of the structure 216, to allow airflow over and under the second portion 1602, in one or more implementations, so that the second portion 1602 is disposed in the airflow path (e.g., the airflow path that includes the output port 211 and the opening 108). However, in other implementations, the second portion 1602 may run along the surface of the second side 1708 in contact with, and/or partially embedded within the second side 1708 of the structure 216. In one or more implementations, the third portion 1700 and the fourth portion 1702 may be section of a contiguous trace that includes the first portion 1601 and the second portion 1602. In one or more other implementations, the third portion 1700 and the fourth portion 1702 may by formed by conductive vias or other vertical conductive structures within the structure 216 that couple to the first portion 1601 and the second portion 1602 on opposing sides of the structure 216.

In the example of FIGS. 16 and 17, airflow through output port 211 may convectively cool the second portion 1602 of the conductive trace 1600, by an amount that corresponds to the velocity and/or amount of airflow. This convective cooling of the second portion 1602 of the conductive trace 1600 may cause a measurable change in the resistance of the second portion 1602, which can be measured to determine the amount of airflow through the output port 211. For example, a pilot tone may be applied to measure the heating and/or cooling of the second portion 1602 using knowledge of the power delivered and current resistance of conductive trace 1600. The electronic device 100 (e.g., audio processor 300) may then adjust the audio output of the speaker 200 based on the measured velocity and/or amount of airflow.

Referring to both FIGS. 2 and 16, an electronic device such as electronic device 100 may be provided with a housing 106 having an opening 108, a speaker 200 disposed within the housing 106 and having an output port 211 aligned with the opening 108 in the housing 106, and an airflow sensor 203 disposed in an airflow path that includes the output port 211 and the opening 108. In this example, the speaker 200 includes a front volume 208, a back volume 212, a structure 216 separating the front volume 208 and the back volume 212, speaker circuitry (e.g., speaker circuitry 219 and/or circuitry 221) disposed in the back volume 212, a conductive trace 1600 coupled to the speaker circuitry and having a first portion 1601 disposed in the back volume 212 and running in parallel to a first side 1706 of the structure 216 that separates the front volume 208 and the back volume 212, and a second portion 1602 disposed in the airflow path.

In this example, the electronic device 100 may also include an audio processor 300 (e.g., implemented using speaker circuitry 219 and/or device circuitry 299). The audio processor 300 may measure a velocity of airflow through the airflow path based on resistive changes in the second portion 1602 of the conductive trace 1600. The audio processor 300 may also adjust audio output (e.g., by modifying one or more frequencies of audio content corresponding to the audio output) of the speaker 200 based on the measured velocity.

Figure 18:
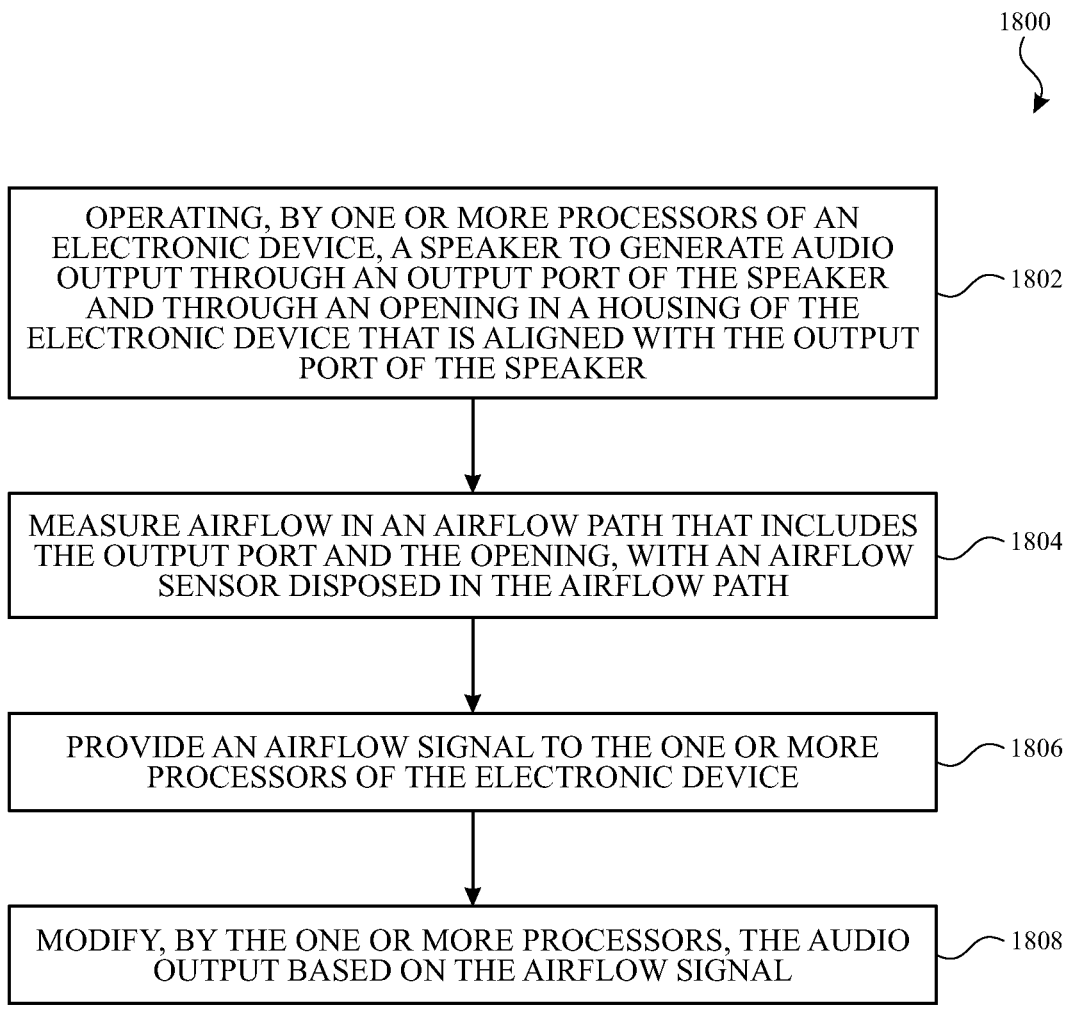
FIG. 18 illustrates a flow diagram for an example process for operating an electronic device with an airflow sensor in accordance with various aspects of the subject technology.

FIG. 18 illustrates a flow diagram of an example process 1800 for operating a speaker of an electronic device, in accordance with implementations of the subject technology. For explanatory purposes, the process 1800 is primarily described herein with reference to the electronic device 100, the speaker 200, and the airflow sensor 203 of FIGS. 1-17. However, the process 1800 is not limited to the electronic device 100, the speaker 200, and the airflow sensor 203 of FIGS. 1-17, and one or more blocks (or operations) of the process 1800 may be performed by one or more other components of other suitable devices, including speakers implemented in other electronic devices and/or audio transducers other than speakers. Further for explanatory purposes, some of the blocks of the process 1800 are described herein as occurring in serial, or linearly. However, multiple blocks of the process 1800 may occur in parallel. In addition, the blocks of the process 1800 need not be performed in the order shown and/or one or more blocks of the process 1800 need not be performed and/or can be replaced by other operations.

As illustrated in FIG. 18, at block 1802 one or more processors of an electronic device, such as the electronic device 100, may operate a speaker (e.g., speaker 200) to generate audio output through an output port (e.g., output port 211) of the speaker and through an opening (e.g., opening 108) in a housing (e.g., housing 106) of the electronic device that is aligned with the output port of the speaker.

At block 1804, the electronic device may measure airflow (e.g., a velocity of the airflow and/or an amount of the airflow) in an airflow path that includes the output port and the opening, with an airflow sensor (e.g., airflow sensor 203) disposed in the airflow path. In one or more implementations, the airflow sensor includes a mesh structure (e.g., mesh structure 289) that spans the opening in the housing. For example, the airflow sensor including the mesh structure may be implemented as described herein in connection with any of the examples of FIGS. 8-15). In one or more other implementations, the airflow sensor may include a portion of a conductive trace that includes another portion that is disposed in a back volume of the speaker. For example, the airflow sensor formed in part by the portion of the conductive trace may be implemented as described herein in connection with the examples of FIGS. 16 and 17.

At block 1806, the electronic device may provide an airflow signal to the one or more processors of the electronic device (e.g., from the airflow sensor 203). The airflow signal may be a raw analog or digital signal (e.g., a resistance, a voltage, a capacitance, a current, a temperature, etc.) from the airflow sensor, from which the velocity and/or amount of the airflow can be derived, or may be a processed airflow signal that includes a measurement of the velocity and/or amount of the airflow.

At block 1808, the one or more processors may modify the audio output based on the airflow signal. For example, when a high velocity of airflow (e.g., airflow having a measured velocity that exceeds a velocity threshold) is detected using the airflow sensor and/or the airflow signal, the one or more processors may apply a damping or a filtering to one or more frequencies of the audio output, may reduce a gain of the audio output, or may otherwise modify the audio output to reduce the velocity and/or amount of air being pushed through the output port and/or the opening in the device housing. In one or more implementations, the one or more processors may continue to measure the airflow using the airflow sensor during subsequent operation of the speaker, and further modify (e.g., increase or decrease the modifications) the audio output, based on the continued airflow sensor feedback from the airflow sensor.

Figure 19:
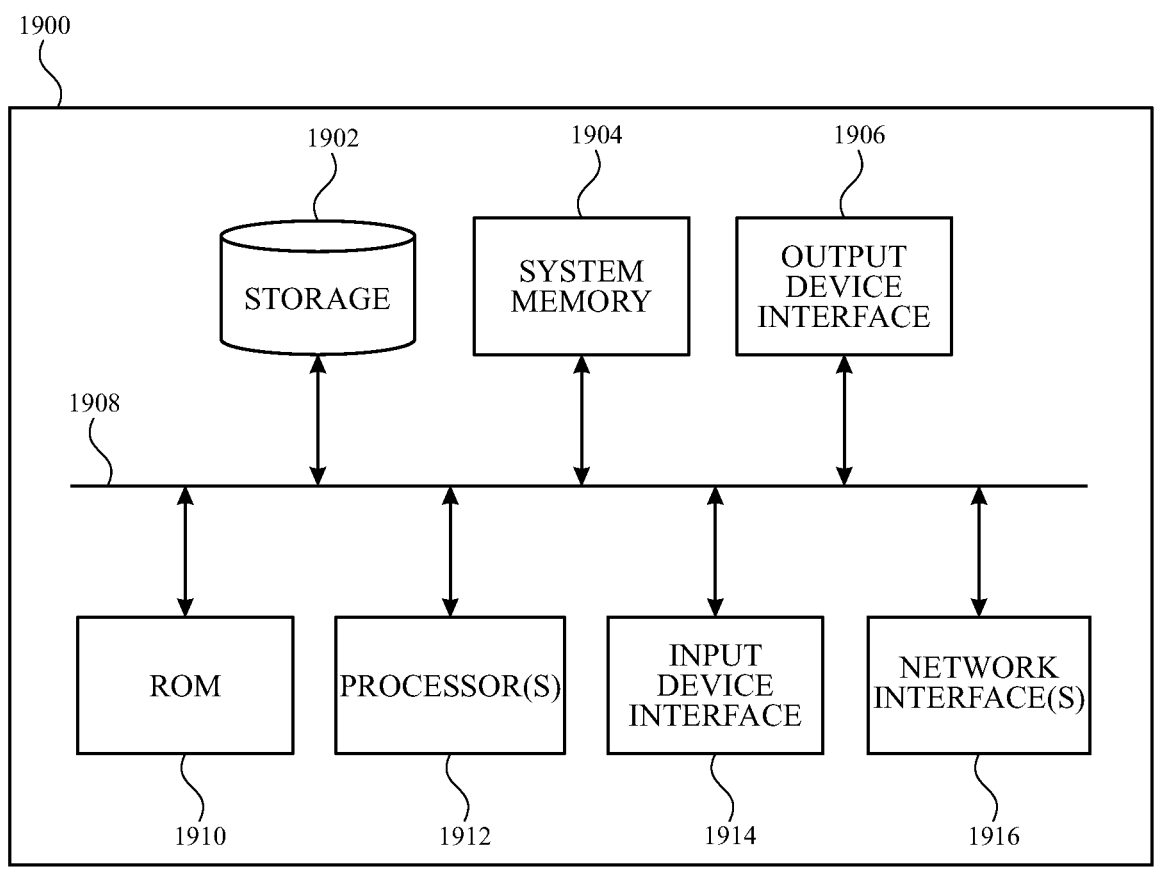
FIG. 19 illustrates an electronic system with which one or more implementations of the subject technology may be implemented.

FIG. 19 illustrates an electronic system 1900 with which one or more implementations of the subject technology may be implemented. The electronic system 1900 can be, and/or can be a part of, one or more of the electronic device 100 shown in FIG. 1. The electronic system 1900 may include various types of computer readable media and interfaces for various other types of computer readable media. The electronic system 1900 includes a bus 1908, one or more processing unit(s) 1912, a system memory 1904 (and/or buffer), a ROM 1910, a permanent storage device 1902, an input device interface 1914, an output device interface 1906, and one or more network interfaces 1916, or subsets and variations thereof.

The bus 1908 collectively represents all system, peripheral, and chipset buses that communicatively connect the numerous internal devices of the electronic system 1900. In one or more implementations, the bus 1908 communicatively connects the one or more processing unit(s) 1912 with the ROM 1910, the system memory 1904, and the permanent storage device 1902. From these various memory units, the one or more processing unit(s) 1912 retrieves instructions to execute and data to process in order to execute the processes of the subject disclosure. The one or more processing unit(s) 1912 can be a single processor or a multi-core processor in different implementations.

The ROM 1910 stores static data and instructions that are needed by the one or more processing unit(s) 1912 and other modules of the electronic system 1900. The permanent storage device 1902, on the other hand, may be a read-and-write memory device. The permanent storage device 1902 may be a non-volatile memory unit that stores instructions and data even when the electronic system 1900 is off. In one or more implementations, a mass-storage device (such as a magnetic or optical disk and its corresponding disk drive) may be used as the permanent storage device 1902.

In one or more implementations, a removable storage device (such as a floppy disk, flash drive, and its corresponding disk drive) may be used as the permanent storage device 1902. Like the permanent storage device 1902, the system memory 1904 may be a read-and-write memory device. However, unlike the permanent storage device 1902, the system memory 1904 may be a volatile read-and-write memory, such as random access memory. The system memory 1904 may store any of the instructions and data that one or more processing unit(s) 1912 may need at runtime. In one or more implementations, the processes of the subject disclosure are stored in the system memory 1904, the permanent storage device 1902, and/or the ROM 1910. From these various memory units, the one or more processing unit(s) 1912 retrieves instructions to execute and data to process in order to execute the processes of one or more implementations.

The bus 1908 also connects to the input and output device interfaces 1914 and 1906. The input device interface 1914 enables a user to communicate information and select commands to the electronic system 1900. Input devices that may be used with the input device interface 1914 may include, for example, alphanumeric keyboards and pointing devices (also called "cursor control devices"). The output device interface 1906 may enable, for example, the display of images generated by electronic system 1900. Output devices that may be used with the output device interface 1906 may include, for example, printers and display devices, such as a liquid crystal display (LCD), a light emitting diode (LED) display, an organic light emitting diode (OLED) display, a flexible display, a flat panel display, a solid state display, a projector, a speaker or speaker module, or any other device for outputting information. One or more implementations may include devices that function as both input and output devices, such as a touchscreen. In these implementations, feedback provided to the user can be any form of sensory feedback, such as visual feedback, auditory feedback, or tactile feedback; and input from the user can be received in any form, including acoustic, speech, or tactile input.

Finally, as shown in FIG. 19, the bus 1908 also couples the electronic system 1900 to one or more networks and/or to one or more network nodes through the one or more network interface(s) 1916. In this manner, the electronic system 1900 can be a part of a network of computers (such as a LAN, a wide area network ("WAN"), or an Intranet, or a network of networks, such as the Internet. Any or all components of the electronic system 1900 can be used in conjunction with the subject disclosure.

In accordance with some aspects of the subject disclosure, an electronic device is provided that includes a housing having an opening; a mesh structure spanning the opening; a speaker disposed within the housing and having an output port aligned with the opening in the housing; and an airflow sensor formed at least in part by the mesh structure.

In accordance with other aspects of the subject disclosure, an electronic device is provided that includes a housing having an opening; a speaker disposed within the housing and having an output port aligned with the opening in the housing; and an airflow sensor disposed in an airflow path that includes the output port and the opening. The speaker includes: a front volume; a back volume; a structure separating the front volume and the back volume; speaker circuitry disposed in the back volume; and a conductive trace coupled to the speaker circuitry and having a first portion disposed in the back volume and running in parallel to a first side of the structure that separates the front volume and the back volume, and a second portion disposed in the airflow path.

In accordance with other aspects of the subject disclosure, a method of operating a speaker of an electronic device is provided, the method including: operating, by one or more processors of the electronic device, the speaker to generate audio output through an output port of the speaker and through an opening in a housing of the electronic device that is aligned with the output port of the speaker; measuring airflow in an airflow path that includes the output port and the opening with an airflow sensor disposed in the airflow path; providing an airflow signal to the one or more processors of the electronic device; and modifying, by the one or more processors, the audio output based on the airflow signal.

Implementations within the scope of the present disclosure can be partially or entirely realized using a tangible computer-readable storage medium (or multiple tangible computer-readable storage media of one or more types) encoding one or more instructions. The tangible computer-readable storage medium also can be non-transitory in nature.

The computer-readable storage medium can be any storage medium that can be read, written, or otherwise accessed by a general purpose or special purpose computing device, including any processing electronics and/or processing circuitry capable of executing instructions. For example, without limitation, the computer-readable medium can include any volatile semiconductor memory, such as RAM, DRAM, SRAM, T-RAM, Z-RAM, and TTRAM. The computer-readable medium also can include any non-volatile semiconductor memory, such as ROM, PROM, EPROM, EEPROM, NVRAM, flash, nvSRAM, FeRAM, FeTRAM, MRAM, PRAM, CBRAM, SONOS, RRAM, NRAM, racetrack memory, FJG, and Millipede memory.

Further, the computer-readable storage medium can include any non-semiconductor memory, such as optical disk storage, magnetic disk storage, magnetic tape, other magnetic storage devices, or any other medium capable of storing one or more instructions. In one or more implementations, the tangible computer-readable storage medium can be directly coupled to a computing device, while in other implementations, the tangible computer-readable storage medium can be indirectly coupled to a computing device, e.g., via one or more wired connections, one or more wireless connections, or any combination thereof.

Instructions can be directly executable or can be used to develop executable instructions. For example, instructions can be realized as executable or non-executable machine code or as instructions in a high-level language that can be compiled to produce executable or non-executable machine code. Further, instructions also can be realized as or can include data. Computer-executable instructions also can be organized in any format, including routines, subroutines, programs, data structures, objects, modules, applications, applets, functions, etc. As recognized by those of skill in the art, details including, but not limited to, the number, structure, sequence, and organization of instructions can vary significantly without varying the underlying logic, function, processing, and output.

While the above discussion primarily refers to microprocessor or multi-core processors that execute software, one or more implementations are performed by one or more integrated circuits, such as ASICs or FPGAs. In one or more implementations, such integrated circuits execute instructions that are stored on the circuit itself.

Various functions described above can be implemented in digital electronic circuitry, in computer software, firmware or hardware. The techniques can be implemented using one or more computer program products. Programmable processors and computers can be included in or packaged as mobile devices. The processes and logic flows can be performed by one or more programmable processors and by one or more programmable logic circuitry. General and special purpose computing devices and storage devices can be interconnected through communication networks.

Some implementations include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, ultra density optical discs, any other optical or magnetic media, and floppy disks. The computer-readable media can store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some implementations are performed by one or more integrated circuits, such as application specific integrated circuits (ASICs) or field programmable gate arrays (FPGAs). In some implementations, such integrated circuits execute instructions that are stored on the circuit itself.

As used in this specification and any claims of this application, the terms "computer", "processor", and "memory" all refer to electronic or other technological devices. These terms exclude people or groups of people. For the purposes of the specification, the terms "display" or "displaying" means displaying on an electronic device. As used in this specification and any claims of this application, the terms "computer readable medium" and "computer readable media" are entirely restricted to tangible, physical objects that store information in a form that is readable by a computer. These terms exclude any wireless signals, wired download signals, and any other ephemeral signals.

Many of the above-described features and applications are implemented as software processes that are specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

In this specification, the term "software" is meant to include firmware residing in read-only memory or applications stored in magnetic storage, which can be read into memory for processing by a processor. Also, in some implementations, multiple software aspects of the subject disclosure can be implemented as sub-parts of a larger program while remaining distinct software aspects of the subject disclosure. In some implementations, multiple software aspects can also be implemented as separate programs. Finally, any combination of separate programs that together implement a software aspect described here is within the scope of the subject disclosure. In some implementations, the software programs, when installed to operate on one or more electronic systems, define one or more specific machine implementations that execute and perform the operations of the software programs.

A computer program (also known as a program, software, software application, script, or code) can be written in any form of programming language, including compiled or interpreted languages, declarative or procedural languages, and it can be deployed in any form, including as a stand alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Some of the blocks may be performed simultaneously. For example, in certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or design.

In one aspect, a term coupled or the like may refer to being directly coupled. In another aspect, a term coupled or the like may refer to being indirectly coupled.

Terms such as top, bottom, front, rear, side, horizontal, vertical, and the like refer to an arbitrary frame of reference, rather than to the ordinary gravitational frame of reference.

Thus, such a term may extend upwardly, downwardly, diagonally, or horizontally in a gravitational frame of reference.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f), unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. An electronic device, comprising:
a housing having an opening;
a mesh structure spanning the opening;
a speaker disposed within the housing and having an output port aligned with the opening in the housing;
an airflow sensor formed at least in part by the mesh structure; and
one or more processors configured to modify an output of the speaker responsive to a determination that an airflow, measured by the airflow sensor and generated by the speaker, is above an airflow threshold.

2. The electronic device of claim 1, wherein the mesh structure comprises a plurality of woven wire structures.

3. The electronic device of claim 1, wherein the airflow sensor comprises a piezoelectric mount that couples an edge of the mesh structure to an interior wall of the opening.

4. The electronic device of claim 3, wherein the piezoelectric mount is a unimorph piezoelectric structure.

5. The electronic device of claim 1, wherein the airflow sensor comprises a piezoelectric mount that rotatably supports a first end of the mesh structure adjacent to a first side of the opening.

6. The electronic device of claim 5, wherein an opposing second end of the mesh structure is movable with respect to an opposing second side of the opening.

7. The electronic device of claim 6, wherein the piezoelectric mount comprises a bimorph piezoelectric structure.

8. The electronic device of claim 1, wherein the airflow sensor comprises at least one capacitive sensor separated from a moveable end of the mesh structure.

9. The electronic device of claim 8, further comprising an elastomeric structure that resiliently couples the moveable end of the mesh structure to the at least one capacitive sensor.

10. The electronic device of claim 1, wherein the airflow sensor comprises an anemometer formed in part by the mesh structure.

11. The electronic device of claim 10, wherein the anemometer comprises a heating element disposed between the mesh structure and a front volume of the speaker and spanning an airflow path including the output port and the opening in the housing.

12. The electronic device of claim 11, further comprising at least one conductive lead coupled between the mesh structure and circuitry configured to measure resistive changes in the mesh structure due to heat transfer to the mesh structure from the heating element by airflow through the airflow path.

13. The electronic device of claim 11, wherein the speaker further comprises a heat pipe structure that thermally couples the heating element to drive circuitry of the speaker.

14. The electronic device of claim 1, wherein the one or more processors are configured to modify the output of the speaker by reducing a power of one or more frequencies of the output of the speaker.

15. The electronic device of claim 1, wherein the airflow threshold comprises a dynamic airflow threshold that depends on audio content in the output of the speaker.

16. A method of operating a speaker of an electronic device, the method comprising:
operating, by one or more processors of the electronic device, the speaker to generate audio output through an output port of the speaker and through an opening in a housing of the electronic device that is aligned with the output port of the speaker;
measuring airflow in an airflow path that includes the output port and the opening, with an airflow sensor disposed in the airflow path;
providing an airflow signal to the one or more processors of the electronic device; and
modifying, by the one or more processors, the audio output based on the airflow signal to reduce the airflow by an amount that depends on the audio output generated by the speaker.

17. The method of claim 16, wherein the airflow sensor comprises a mesh structure that spans the opening in the housing.

18. An electronic device, comprising:
a speaker; and
at least one processor configured to:
operate the speaker to generate an audio output through an output port of the speaker and through an opening in a housing of the electronic device that is aligned with the output port of the speaker;
measure airflow in an airflow path that includes the output port and the opening, with an airflow sensor disposed in the airflow path; and
modify the audio output based on a determination that the measured airflow is above an airflow threshold.

19. The electronic device of claim 18, wherein the airflow sensor comprises a mesh structure that spans the opening in the housing.

20. The electronic device of claim 19, wherein the mesh structure comprises a plurality of woven wire structures.

21. The electronic device of claim 19, wherein the airflow sensor comprises a piezoelectric mount that couples an edge of the mesh structure to an interior wall of the opening in the housing.

22. The electronic device of claim 21, wherein the piezoelectric mount rotatably supports a first end of the mesh structure adjacent to a first side of the opening, and wherein an opposing second end of the mesh structure is movable with respect to an opposing second side of the opening.

* * * * *